(12) United States Patent
Sun et al.

(10) Patent No.: US 11,251,237 B2
(45) Date of Patent: Feb. 15, 2022

(54) DISPLAY SUBSTRATE AND MANUFACTURING METHOD THEREOF, DISPLAY CONTROL METHOD

(71) Applicant: BOE TECHNOLOGY GROUP CO., LTD., Beijing (CN)

(72) Inventors: Zhongyuan Sun, Beijing (CN); Jinxiang Xue, Beijing (CN); Liang Chen, Beijing (CN); Guangcai Yuan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 72 days.

(21) Appl. No.: 16/632,948

(22) PCT Filed: Feb. 2, 2019

(86) PCT No.: PCT/CN2019/074573
§ 371 (c)(1),
(2) Date: Jan. 22, 2020

(87) PCT Pub. No.: WO2020/155140
PCT Pub. Date: Aug. 6, 2020

(65) Prior Publication Data
US 2021/0225961 A1    Jul. 22, 2021

(51) Int. Cl.
*H01L 51/52* (2006.01)
*H01L 27/32* (2006.01)
(Continued)

(52) U.S. Cl.
CPC ......... *H01L 27/3225* (2013.01); *G09G 3/035* (2020.08); *G09G 3/3225* (2013.01);
(Continued)

(58) Field of Classification Search
CPC . H01L 27/3225; H01L 27/3276; H01L 51/56; H01L 51/0097; H01L 2227/323; H01L 2251/5338; H01L 27/3246; G09G 3/035; G09G 3/3225; G09G 2300/026; G09G 3/20; G02B 26/0825
(Continued)

(56) References Cited

U.S. PATENT DOCUMENTS 9,691,996 B2    6/2017    Lee
2011/0290296 A1   12/2011   Daniel et al.
(Continued)

FOREIGN PATENT DOCUMENTS

CN    105007681 A    10/2015
CN    106910842 A    6/2017
(Continued)

*Primary Examiner* — Abdul-Samad A Adediran
(74) *Attorney, Agent, or Firm* — Dilworth & Barrese, LLP.; Michael J. Musella, Esq.

(57) ABSTRACT

A display substrate and a manufacturing method thereof, and a display control method. The display substrate includes: a stretchable substrate, a flexible layer on the stretchable substrate, and a plurality of display units and connection parts on the flexible layer. The connection parts are between the display units and are flexible to allow the display substrate to stretch or retract. The connection part includes a deformation sensor configured to detect a deformation state of the connection part.

18 Claims, 8 Drawing Sheets

(51) Int. Cl.
  *G09G 3/00*       (2006.01)
  *G09G 3/3225*     (2016.01)
  *H01L 51/56*      (2006.01)
  *H01L 51/00*      (2006.01)

(52) U.S. Cl.
  CPC .......... *H01L 27/3276* (2013.01); *H01L 51/56* (2013.01); *G09G 2300/026* (2013.01); *H01L 51/0097* (2013.01); *H01L 2227/323* (2013.01); *H01L 2251/5338* (2013.01)

(58) Field of Classification Search
  USPC .......................................................... 345/55
  See application file for complete search history.

(56) References Cited

U.S. PATENT DOCUMENTS

| | | | |
|---|---|---|---|
| 2013/0278486 A1* | 10/2013 | Duerksen | G09G 3/20 345/55 |
| 2015/0305146 A1 | 10/2015 | Tomita | |
| 2016/0268352 A1* | 9/2016 | Hong | H01L 51/0097 |
| 2018/0046221 A1* | 2/2018 | Choi | G02B 26/0825 |
| 2019/0088894 A1 | 3/2019 | Park et al. | |
| 2020/0027945 A1* | 1/2020 | Kim | H01L 27/3246 |

FOREIGN PATENT DOCUMENTS

| | | |
|---|---|---|
| CN | 107221550 A | 9/2017 |
| CN | 108878486 A | 11/2018 |
| TW | 201640708 A | 11/2016 |

\* cited by examiner

DISPLAY SUBSTRATE AND MANUFACTURING METHOD THEREOF, DISPLAY CONTROL METHOD

TECHNICAL FIELD

Embodiments of the present disclosure relate to a display substrate and a manufacturing method thereof, and a display control method.

BACKGROUND

Organic light emitting diode (OLED) display devices have received widespread attention because of advantages of self-illumination, light weight, wide viewing angle, low power consumption, high response speed, or the like. Due to its structural characteristics, the OLED display device may be bendable, foldable, stretchable, or the like, and thus has a wider range of applications.

SUMMARY

At least one embodiment provides a display substrate, comprising: a plurality of display units; connection parts among the display units, the connection parts being flexible; a stretchable substrate, and a flexible layer provided on the stretchable substrate. The plurality of display units and the connection parts are provided on the flexible layer; and each connection part comprises a deformation sensor configured to detect deformation states of the connection part.

For example, in the display substrate provided by at least one embodiment of the present disclosure, the plurality of display units are arranged in an array, and each connection part is located between two adjacent rows of display units or two adjacent columns of display units.

For example, the display substrate provided by at least one embodiment of the present disclosure further comprises a controller coupled with the deformation sensors and configured to receive feedback signals related to the deformation states of the deformation sensors, and adjust display images of the display units according to the feedback signals.

For example, in the display substrate provided by at least one embodiment of the present disclosure, the flexible layer comprises a plurality of openings at the connection parts.

For example, in the display substrate provided by at least one embodiment of the present disclosure, each opening is star-shaped, and angles of the star-shaped opening extend toward the connection parts of the adjacent display units.

For example, in the display substrate provided by at least one embodiment of the present disclosure, at least part of each deformation sensor is provided in a corresponding opening.

For example, in the display substrate provided by at least one embodiment of the present disclosure, the deformation sensors are piezoelectric sensors, each of which comprises a first electrode, a second electrode, and a piezoelectric material layer between the first and second electrodes, the piezoelectric material layer being configured to detect the stretching extent and retracting extent.

For example, in the display substrate provided by at least one embodiment of the present disclosure, each piezoelectric material layer comprises a flexible piezoelectric material.

For example, the display substrate provided by at least one embodiment of the present disclosure further comprises an adhesive layer between the stretchable substrate and the flexible layer and combining the stretchable substrate and the flexible layer; the piezoelectric material layer is disposed in the openings.

For example, in the display substrate provided by at least one embodiment of the present disclosure, the first electrode, the second electrode, and the piezoelectric material layer are arranged in a direction parallel to the stretchable substrate; the piezoelectric material layer is provided on the adhesive layer exposed by a corresponding opening, and the first electrode and second electrodes are provided on the flexible layer, or on the adhesive layer exposed by the corresponding opening.

For example, in the display substrate provided by at least one embodiment of the present disclosure, each connection part comprises a first wiring on the flexible layer. The first wiring extends curvedly and is electrically connected with a corresponding piezoelectric sensor and configured to transmit electrical signals for the corresponding piezoelectric sensor.

For example, in the display substrate provided by at least one embodiment of the present disclosure, the connection part further comprises a second wiring located on the flexible layer; the second wiring extends curvedly and is electrically connected with the plurality of display units and configured to transmit electrical signals for the plurality of display units.

For example, in the display substrate provided by at least one embodiment of the present disclosure, the first wiring and the second wiring extend in parallel to each other.

For example, in the display substrate provided by at least one embodiment of the present disclosure, a portion of the connection parts other than another portion covered by the first wiring and the second wiring does not comprise the flexible layer.

At least one embodiment provides a method of manufacturing a display substrate, comprising, forming a plurality of display units and connection parts among the display units, the connection units being flexible to allow the display substrate to stretch or retract; forming a deformation sensor in each connection part, the deformation sensors being configured to detect a deformation state of each connection part.

For example, the method provided by at least one embodiment of the present disclosure further comprises: providing a stretchable substrate, and combining a flexible layer onto the stretchable substrate. The flexible layer comprises a first part corresponding to the plurality of display units and a second part corresponding to the connection parts; the display units are formed on the first part of the flexible layer, openings are formed in the second part of the flexible layer. Each deformation sensor is at least partially provided in a corresponding opening and on the stretchable substrate.

For example, in the manufacturing method provided by at least one embodiment of the present disclosure, the forming of the plurality of display units and the connection parts among the display units comprises: forming the flexible layer on a rigid base substrate; forming a display array of the display units on the first part of the flexible layer, forming the wirings for the connection parts on the second part of the flexible layer and forming the openings in the second part of the flexible layer; and the providing the stretchable substrate and combining the flexible layer onto the stretchable substrate comprises: releasing the flexible layer with the display array, the wiring and the openings formed thereon from the rigid base substrate and combining the released flexible layer onto the stretchable substrate.

For example, in the manufacturing method provided by at least one embodiment of the present disclosure, each deformation sensor is a piezoelectric sensor, the forming of the piezoelectric sensor comprises: forming the first electrode, the second electrode, and the piezoelectric material layer between the first and second electrodes. The first electrode and/or the second electrode and/or the piezoelectric material layer are formed by an inkjet printing process.

At least one embodiment provides a display control method of the display substrate, comprising: detecting a deformation state of each connection part of the display substrate when it is stretched or retracted by the deformation sensor; and adjusting the display image of each display unit of the display substrate based on a signal detected by the deformation sensor.

BRIEF DESCRIPTION OF THE DRAWINGS

To illustrate the technical solution of the embodiments of the present disclosure more clearly, the accompanied drawings of the embodiments will be briefly introduced below. It is apparent that the accompanied drawings as described below are only related to some embodiments of the present disclosure, but not limitative of the present disclosure.

DETAILED DESCRIPTION

In order to make objects, technical details and advantages of the embodiments of the disclosure apparent, technical solutions of the embodiments will be described in a clearly and completely way in connection with the drawings related to the embodiments of the disclosure. Apparently, the described embodiments are a part but not all of the embodiments of the disclosure. Based on the described embodiments herein, one of ordinary skill in the art can obtain other embodiment(s), without any creative labor, which shall be within the scope of the present disclosure.

Figure 1A:
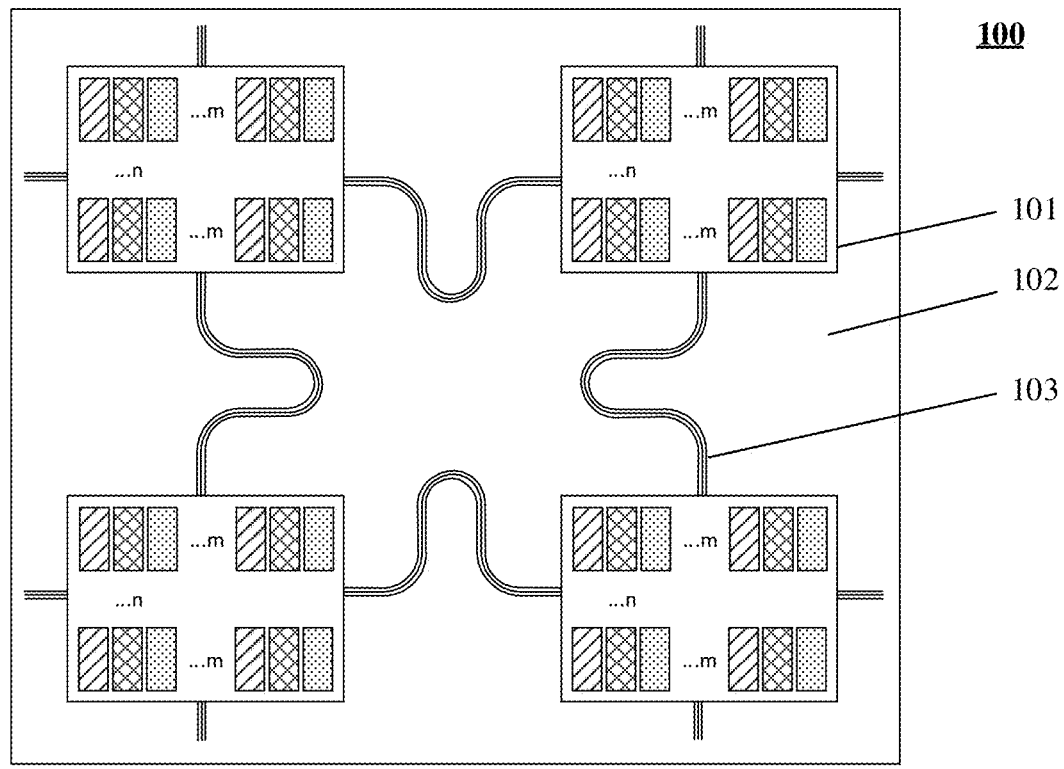
FIG. 1A is a schematic plan view of a stretchable display substrate.

Unless otherwise defined, all the technical and scientific terms used herein have the same meanings as commonly understood by one of ordinary skill in the art to which the present disclosure belongs. The terms, such as 'first,' 'second,' or the like, which are used in the description and the claims of the present disclosure, are not intended to indicate any sequence, amount or importance, but for distinguishing various components. The terms, such as 'comprise/comprising,' 'include/including,' or the like are intended to specify that the elements or the objects stated before these terms encompass the elements or the objects and equivalents thereof listed after these terms, but not exclude other elements or objects. The terms, such as "connect/connecting/connected," "couple/coupling/coupled" or the like, are not limited to a physical connection or mechanical connection, but may include an electrical connection/coupling, directly or indirectly. The terms, 'on,' 'under,' 'left,' 'right,' or the like are only used to indicate relative position relationship, and when the absolute position of the object which is described is changed, the relative position relationship may be changed accordingly Generally, as shown in FIG. 1A, a stretchable display substrate 100 includes a plurality of display units 101 and elastic connection parts 102 configured to connect the display units 101. The plurality of display units 101 are provided in parallel and can display an image individually or collectively; for example, a structure connecting adjacent vertical and horizontal display units 101, such as a wiring 103, may be arranged in the elastic connection part 102, and the wiring 103 is S-shaped wiring, for example.

Figure 1B:
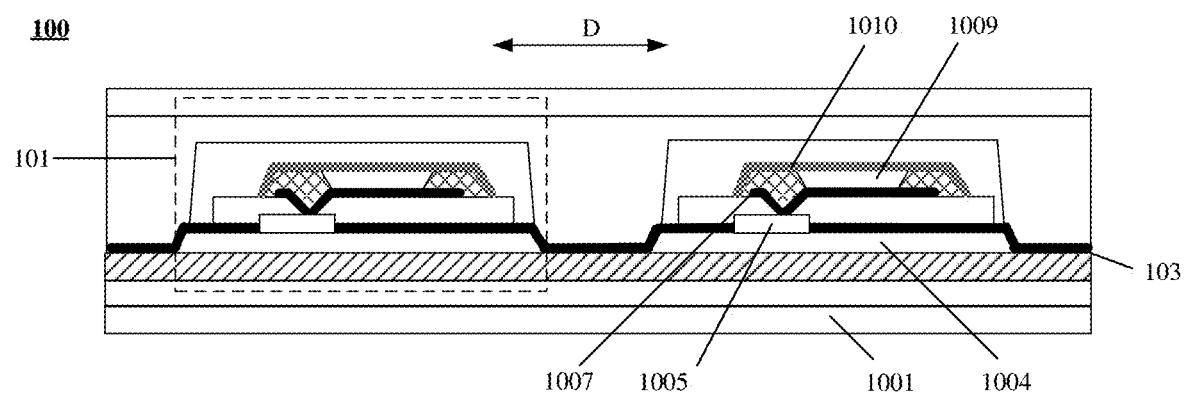
FIG. 1B is a schematically sectional view of the stretchable display substrate shown in FIG. 1A.

FIG. 1B is a schematically sectional view of the display substrate shown in FIG. 1A, schematically showing a connection relation between each one pixel unit at a boundary in adjacent display units and a pixel unit in adjacent display units of the display substrate shown in FIG. 1A. As shown in FIG. 1B, the plurality of display units 101, for example, may be provided on the stretchable substrate 1001 respectively by a barrier layer 1004. For example, each display unit 101 may include one or more pixel units for display (one pixel unit is shown in the drawing as an example), and each of the pixel units includes a thin film transistor 1005 configured to control whether the pixel unit emits light and a light intensity, an organic light emitting diode configured to emit light, or the like. For example, the organic light emitting diode includes an anode layer 1007, a light emitting layer 1009, a cathode layer 1010, etc., which are layered. By applying a voltage to the anode layer 1007 and the cathode layer 1010, the light emitting layer 1009 sandwiched between the anode layer 1007 and the cathode layer 1010 is enabled to emit light.

For example, when the stretchable display substrate 100 is subjected to a horizontal force (the direction denoted by a double sided arrow D in FIG. 1B), the display unit 101 tends not to be subjected to an amount of deformation of the stretchable display substrate in a stretching process or be subjected to a small amount of deformation, and the elastic connection part 102 is subjected to a larger amount of deformation, thereby achieving a stretching effect of the entire display substrate. However, when the elastic connection part 102 is subjected to the amount of deformation, the relative positions of the plurality of display units 101 vary, and therefore, when the plurality of display units 101 display one image, the problem may occur, for example, the displayed image is not smooth, or is distorted.

At least one embodiment of the present disclosure provides a display substrate, including: a plurality of display units; connection parts among the display units; a stretchable substrate, and a flexible layer provided on the stretchable substrate. The plurality of display units and the connection parts are provided on the flexible layer, and the connection part is flexible to allow the display substrate to stretch or retract. The connection part includes a deformation sensor configured to detect a deformation state of the elastically deformed part.

At least one embodiment of the present disclosure provides a display control method of the above-mentioned display substrate, including: detecting a deformation state of a connection part of a display substrate in a stretching operation by a deformation sensor; adjusting a display image of a display unit of the display substrate according to a signal detected by the deformation sensor.

Hereinafter, the display substrate and manufacturing method thereof, and the display control method according to some embodiments will be explained.

Figure 2A:
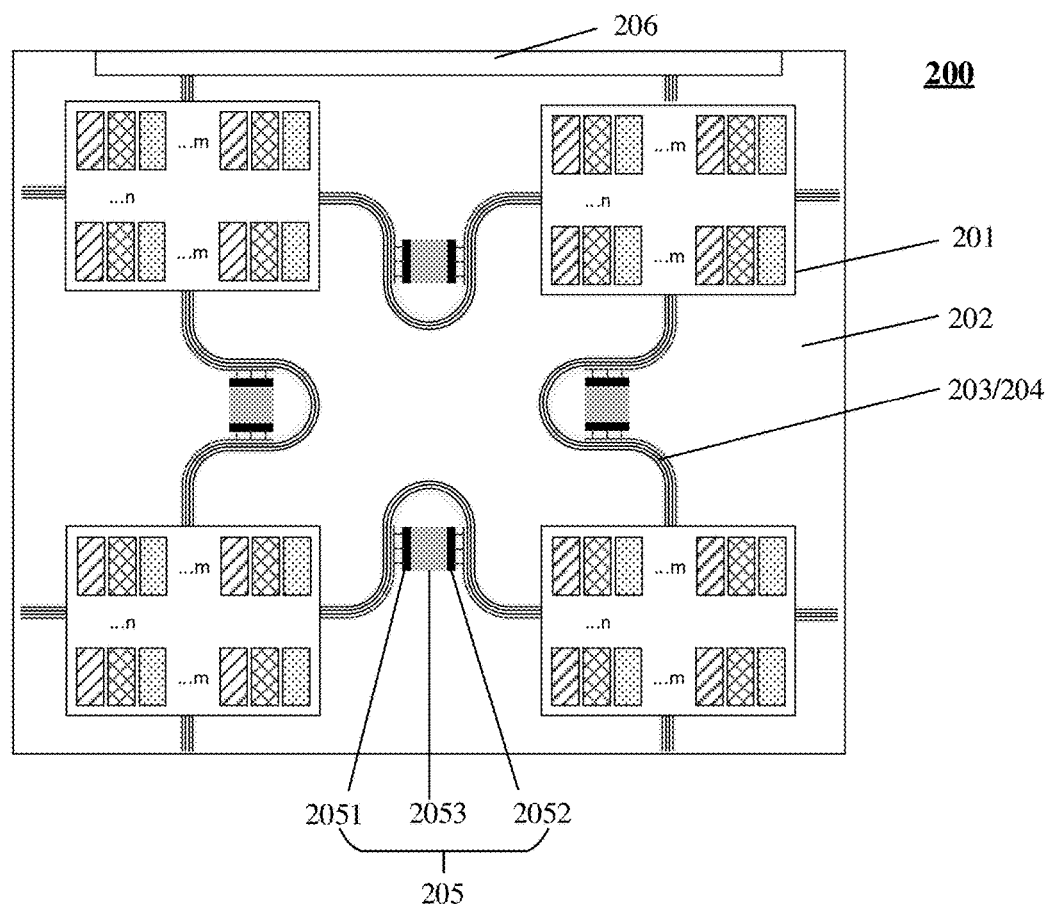
FIG. 2A is a schematic plan view of a display substrate according to an embodiment of the present disclosure.
Figure 2B:
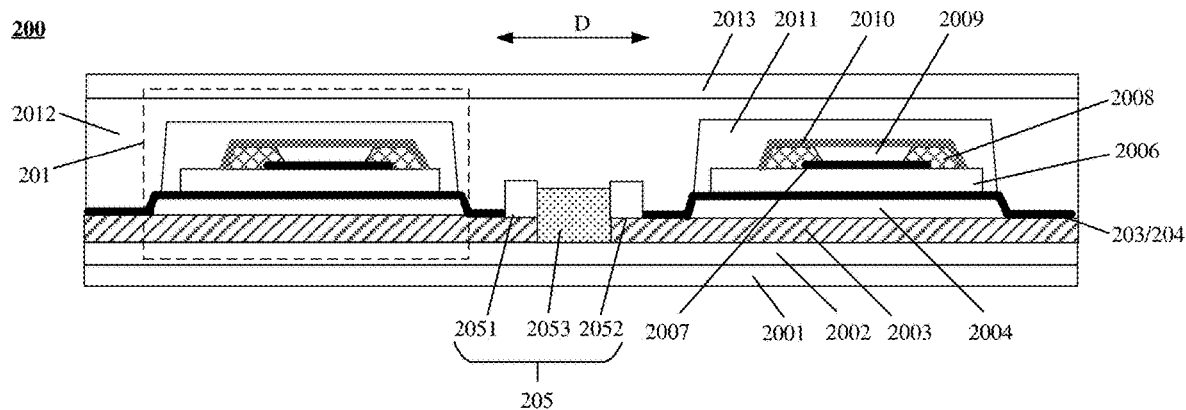
FIG. 2B is a schematically sectional view of the display substrate shown in FIG. 2A.
Figure 3:
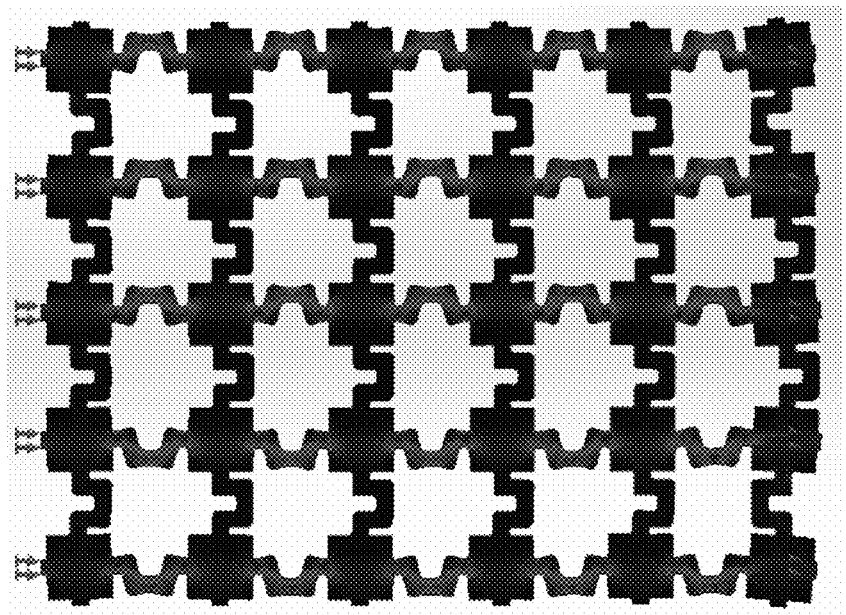
FIG. 3 is a distribution diagram of a stress state of a display substrate according to an embodiment of the present disclosure.

At least one embodiment of the present disclosure provides a display substrate. FIG. 2A is a schematic plan view of a display substrate; FIG. 2B is a schematically sectional view of the display substrate shown in FIG. 2A, schematically showing a connection relation between each one pixel unit at a boundary in adjacent display units of the display substrate shown in FIG. 2A, the two pixel units, and the deformation sensor located at the connection part. FIG. 3 is a distribution diagram of a stress state of a display substrate according to the embodiment of the present disclosure.

As shown in FIGS. 2A and 2B, a display substrate 200 includes a plurality of display units 201 and connection parts 202 among the display units 201. The plurality of display units 201 is configured to display image(s). The connection part 202 is flexible to allow the display substrate 200 to stretch or retract. In this way, the display substrate 200 is a stretchable display substrate. Each connection part 202 includes a deformation sensor 205 configured to detect a deformation state of the connection part 202. For example, the plurality of display units 201 are arranged in an array with a plurality of rows and a plurality of columns. The region between two adjacent rows of display units 201 and the region between two adjacent columns of display units 201 are configured as connection parts 202. In other embodiments, the plurality of display units 201 may be arranged in other forms, and the embodiments of the present disclosure are not limited thereto.

For example, each connection part 202 includes an elastically deformed part which is mainly subjected to an amount of elastic deformation when the display substrate 200 is stretched or retracted, and the elastically deformed part may generate a large amount of deformation when the display substrate 200 is stretched or retracted, for example. At this point, the deformation sensor 205 may be at least partially disposed in the elastically deformed part, for example.

For example, the deformation state detected by the deformation sensor 205 includes, but not limited to, a deformation way (e.g., stretching or retracting, or the like), an amount of deformation (e.g., a stretching amount or a retracting amount, or the like) of the elastically deformed part, or the like.

For example, in some examples of the present embodiment, the deformation sensor 205 may be in signal communication with an alarm unit (for example, an audible alarm, a light alarm, or the like). When the deformation sensor 205 detects that the amount of deformation of the connection part 202, such as the elastically deformed part of the connection part 202, reaches a given value, for example, a maximum amount of deformation of the elastically deformed part, the alarm unit can issue an alarm to avoid a damage to the display substrate due to a force further applied by a user.

For example, in some examples of the present embodiment, as shown in FIG. 2A, the display substrate 200 may further include a controller 206. For example, the controller 206 is coupled with the deformation sensors 205, and is configured to receive a feedback signal related to the deformation state of each deformation sensor 205 and to adjust the display images of the display units 201 according to the feedback signals. For example, the controller 206 may be disposed in the peripheral area of the display substrate 200 other than the area where the display units 201 and the connection parts 202 (e.g., in a manner of bonding) are located, so as not to affect the display effect of the display substrate 200.

For example, in the case when the plurality of the display unit 201 display one image, when the connection part 202 is subjected to a force and deformed, the display image of the plurality of display units 201 may also be deformed therewith. At this point, the deformation sensor 205 can detect the deformation state of the connection part 202, for example, the amount of deformation, and feed the information of deformation state to the controller 206, the controller 206 may adjust the display image of the display unit 201 in accordance with the feedback signal, for example, reversely deform the display image appropriately to cancel out the deformation of the display substrate 200 due to stretch or retract operation, compensating the display image of the plurality of display units 201 and enabling the display image to be more fluent.

In the present embodiment, the deformation sensor 205 may be a strain sensor, such as an MEMS capacitance strain sensor, a resistance strain sensor, a piezoelectric sensor based on a piezoelectric effect, or the like, and the embodiments of the present disclosure are not limited thereto.

In the present embodiment, the controller 206 may be any control unit having data processing capability and/or program executing capability, such as a central processing unit (CPU), a digital signal processor (DSP), a single-chip microcomputer, or the like. For example, the controller 206 may further include a storage unit that stores image processing data, parameters, or the like, of the display substrate 200 under a given amount of deformation (for example, a stretching amount or a retracting amount). For example, the storage unit may be a storage medium in any form, such as a volatile memory, a non-volatile memory, a semiconductor memory, a magnetic medium memory, or the like.

For example, in the present embodiment, as shown in FIGS. 2A and 2B, each deformation sensor 205 is, for example, a piezoelectric sensor, including a first electrode 2051, a second electrode 2052, and a piezoelectric material layer 2053 provided between the first electrode 2051 and the second electrode 2052, and the piezoelectric material layer 2053 is configured to detect the stretching amount and the retracting amount.

For example, the piezoelectric sensor may be disposed at a position where the connection part 202 has the maximum amount of deformation under a force. In this way, the maximum amount of deformation of the connection part 202 under a force can be detected. For example, before the connection part 202 is provided with the piezoelectric sensor, the distribution diagram of the stress state of the display substrate 200 when it is stretched may be tested by experiments, obtaining the position at which the display substrate 200 has the maximum stress in a stretched state, and the piezoelectric sensor is disposed at this position. For example, the distribution diagram of the stress state of the display substrate 200 in a stretched state according to the present embodiment is as shown in FIG. 3. As shown in FIG. 3, a middle position between adjacent display units 201 of the display substrate 200 has the maximum stress. So, the piezoelectric sensor may be disposed at the middle position between the adjacent display units 201.

For example, the piezoelectric material layer 2053 of the piezoelectric sensor includes a flexible piezoelectric material which may include an organic piezoelectric material or an inorganic/organic composite piezoelectric material. For example, the organic piezoelectric material includes polyvinylidene fluoride, or the like, the composite piezoelectric material is a composite material in which the inorganic piezoelectric material is added in the organic piezoelectric material, the inorganic piezoelectric material includes a perovskite material, such as aluminum nitride, zinc oxide, titanate barium, lead zirconate titanate. The piezoelectric material layer 2053 includes a flexible piezoelectric material which enables the piezoelectric material layer 2053 to better match the deformation state of the connection part 202, and to detect the deformation state accurately. The material of the piezoelectric material layer 2053 may be selected according to the actual application, for example, a tensile property of the display substrate, or the like, and the embodiments of the present disclosure are not limited thereto.

For example, the first electrode 2051 and/or the second electrode 2052 of the piezoelectric sensor may be made of a metal material, such as Ti, Al, Mo, Ag, or an alloy thereof; or a conductive oxide, such as ITO, IZO, ZnO, $In_2O_3$, IGO, AZO, and the embodiments of the present disclosure are not limited thereto.

For example, as shown in FIG. 2B, the display substrate 200 according to the present embodiment may further include a stretchable substrate 2001 and a flexible layer 2003 disposed on the stretchable substrate 2001. For example, the flexible layer 2003 includes a first part (i.e., the part covered by the display units 201) where the plurality of display units 201 are disposed and a second part (i.e., the part covered by the connection parts 202) where the connection parts 201 are disposed. The second part of the flexible layer 202 includes an opening, and the connection part 202 corresponding to the opening may be subjected to a relatively large amount of deformation when the display substrate 200 is stretched. Therefore, the connection part 202 corresponding to the opening is the elastically deformed part of the connection part 202 (to be described later in detail), for example.

For example, the plurality of display units 201 are disposed on the first part of the flexible layer 2003 by an isolation layer 2004, respectively. For example, each display unit 201 may include one or more pixel unit(s) for display (in the drawings, one pixel unit is shown as an example), and each of the pixel units includes a thin film transistor configured to control the pixel unit to emit light or not, an organic light emitting diode, or the like. For example, the organic light emitting diode includes an anode layer 2007, a light emitting layer 2009, a cathode layer 2010, or the like, which are layered on each other. In the present embodiment, the isolation layer 2004 may prevent water, oxygen and other impurities from entering each device of the pixel unit provided on the isolation layer 2004. For example, the isolation layer 2004 may have a single-layer or multilayer structure made of an inorganic material, such as $SiO_x$, $SiON_x$, $SiN_x$, or the like.

For example, the display substrate 200 according to the present embodiment further includes an adhesive layer 2002 located between the stretchable substrate 2001 and the flexible layer 2003 and configured to bind the stretchable substrate 2001 and the flexible layer 2003. For example, the adhesive layer 2002 has a tensile property same as or similar to that of the stretchable substrate 2001. For example, the adhesive layer 2002 may be made of Optically Clear Adhesive (OCA), for example, a resin material, such as an epoxy resin, silicone resin, acrylic resin, or the like.

For example, in the present embodiment, the opening included by the second part of the flexible layer 202 exposes the adhesive layer 2002. The piezoelectric material layer 2053 of the piezoelectric sensor may be disposed in the opening, for example, it is arranged on the adhesive layer 2002 exposed by the opening, such that the piezoelectric material layer 2053 of the piezoelectric sensor merely covers the stretchable substrate 2001 and the adhesive layer 2002. At this point, since no other structure is provided on the stretchable substrate 2001 and the adhesive layer 2002 at the position of the opening, the opening position tends to have the maximum amount of deformation during the display substrate 200 is deformed due to stretching or retracting, and the piezoelectric material layer 2053 may detect the maximum amount of deformation of the connection part 202 with the above-mentioned arrangement.

For example, in the display substrate 200 according to the present embodiment, the first electrode 2051 and the second electrode 2052 may be disposed on the flexible layer 2003, or on the adhesive layer 2002 exposed by the opening. For example, as shown in FIG. 2B, the first electrode 2051 and the second electrode 2052 are provided on the flexible layer 2003.

For example, in at least one embodiment of the present disclosure, the first electrode 2051, the second electrode 2052, and the piezoelectric material layer 2053 are arranged in a direction parallel to the stretchable substrate 2001. That is, the first electrode 2051, the second electrode 2052, and the piezoelectric material layer 2053 are disposed in a same layer, as shown in FIG. 2B, for example. This arrangement may avoid the interference of the piezoelectric material layer 2053 by the first electrode 2051 and the second electrode 2052 in a process of detecting stretching deformation or retracting deformation, and facilitate the wiring of the first electrode 2051 and the second electrode 2052.

For example, in the present embodiment, as shown in FIGS. 2A and 2B, each connection part 202 includes a first wiring 204 located on the flexible layer 2003. For example, the first wiring 204 extends curvedly and is electrically connected to the piezoelectric sensor 205, for example, it is electrically connected to the first electrode 2051 and the second electrode 2052 of the piezoelectric sensor 205, so as to transmit electrical signals for the piezoelectric sensor 205. For example, the first wiring 204 may also be connected to the controller 206, such that the piezoelectric sensor 205 may transmit the feedback signals including the information of deformation states to the controller 206 through the first wiring 204. For example, the first wiring 204 may be arranged in a U, S, or Z shape, or the like, such that the pressure on the first wiring 204 may be relieved by a change in the wiring shape when the connection part 202 is stretched.

For example, in the present embodiment, the connection part 202 further includes a second wiring 203 located on the flexible layer 2003. For example, the second wiring 203 extends curvedly and is electrically connected to a plurality of adjacent display units 201, for example, it is electrically connected to a plurality of adjacent vertical and horizontal display units 201, so as to transmit electrical signals for the plurality of display units 201. For example, the second wiring 203 may also be connected to the controller 206, such that the controller 206 may transmit display signals for adjusting the display image(s) to the plurality of display units 201 through the second wiring 203. For example, the second wiring 203 may also be arranged in a U, S, or Z shape, or the like, such that the pressure on the second wiring 203 may be relieved by a change in the wiring shape when the connection part 202 is stretched.

For example, in the present embodiment, as shown in FIG. 2A, the first wiring 204 and the second wiring 203 extend in parallel, and thus they have the same bent state. For example, when the connection part 202 is deformed elastically, the first wiring 204 and the second wiring 203 may match the elastic deformation of the connection part 202 or absorb an effect of the elastic deformation thereon by changing the wiring shape.

For example, the first wiring 204 and/or the second wiring 203 may be made of an elastic metal material, such as titanium, aluminum, silver, gold, or the like, or an alloy thereof, or other conductive materials, such as a conductive rubber, graphene, or the like, and the embodiments of the present disclosure are not limited thereto.

For example, in the present embodiment, the portion of the connection part 202 other than the portion covered by the first wiring 204 and the second wiring 203 excludes the flexible layer 203. For example, only the portion of the flexible layer 2003 in an orthographic projection region of the first wiring 204 and the second wiring 203 in a direction perpendicular to the stretchable substrate 201 is retained, such that the display substrate 200 may realize a relatively large amount of deformation by the stretchable substrate 2001. In this arrangement, the portion of the connection part 202 other than the portion covered by the first wiring 204 and the second wiring 203 is formed as the opening of the flexible layer 2003, to define the elastically deformed part of the connection part 202. The elastically deformed part is subjected to a relatively large amount of deformation when the display substrate is stressed. That is, the elastically deformed part is a main deformed part. Herein, it is to be noted that other parts of the display substrate 200 other than the elastically deformed part (e.g., the part of the connection part 202 covered by the first wiring 204 and the second wiring 203 and the display unit 101) may also generate a given amount of deformation, and this amount of deformation contributes to the amount of deformation of the entire display substrate 200 to a small extent.

For example, in the present embodiment, the stretchable substrate 2001 has a higher elasticity than the flexible layer 2003, i.e., it is elastically deformed more easily. For example, the stretchable substrate 2001 may be made of a material with a relatively large elasticity, such as polydimethylsiloxane (PDMS), stretchable rubber, silicone, or the like. The flexible layer 2003 may be made of a flexible material, such as polyimide (PI), polyethylene terephthalate (PET), or the like. In the above-mentioned arrangement, the flexible layer 2003 may be deformed when the stretchable substrate 2001 is under a force, for example, when it is stretched, the first wiring 204 and the second wiring 203 provided on the buffer flexible layer 2003 are applied with a force, so as to avoid a damage to the first wiring 204 and the second wiring 203, for example, they are broken.

It is to be noted that the display substrate according to the present embodiment may further include other structures. For example, as shown in FIG. 2B, the display substrate 200, for example, may further include a second adhesive layer 2012, a stretchable package substrate 2013, or the like, the display unit 201 may further include a planarization layer 2006, a pixel defining layer 2008, and a package layer 2011, or the like, and the embodiments of the present disclosure are not limited thereto.

Figure 4A:
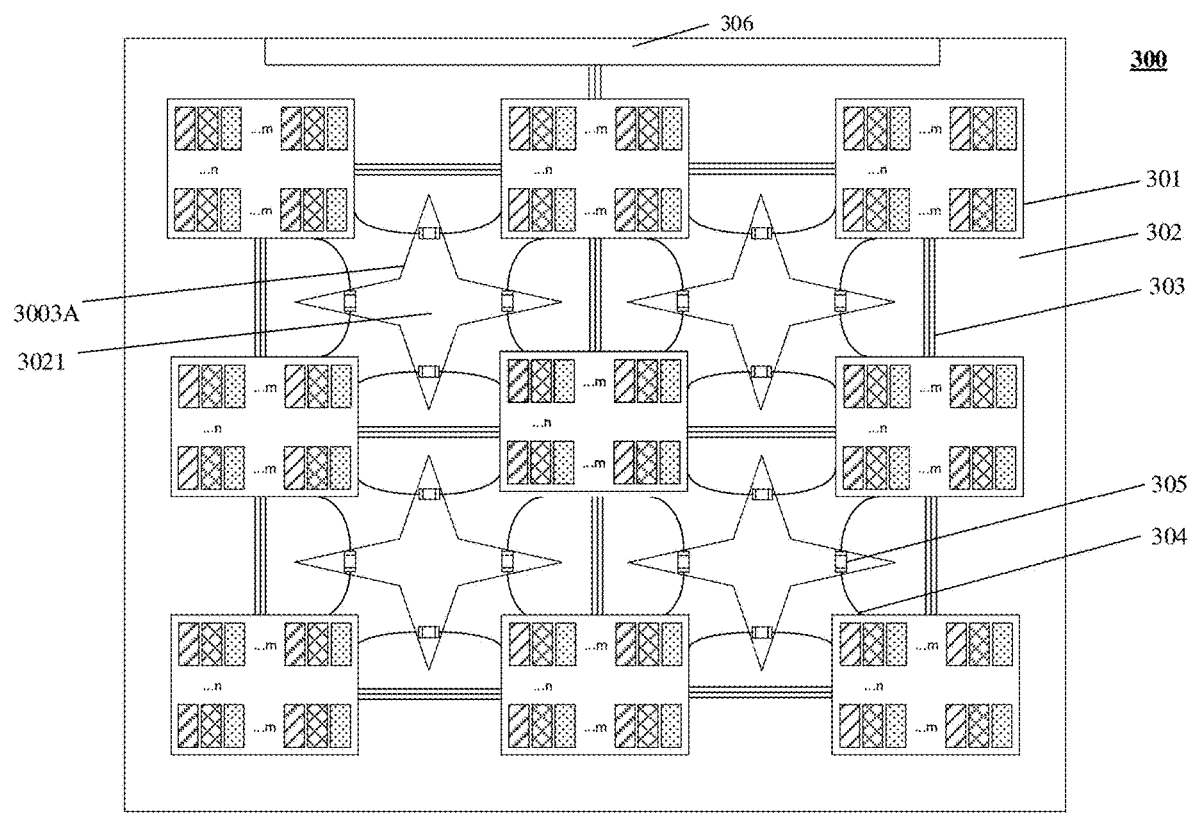
FIG. 4A is a schematic plan view of another display substrate according to an embodiment of the present disclosure.
Figure 4B:
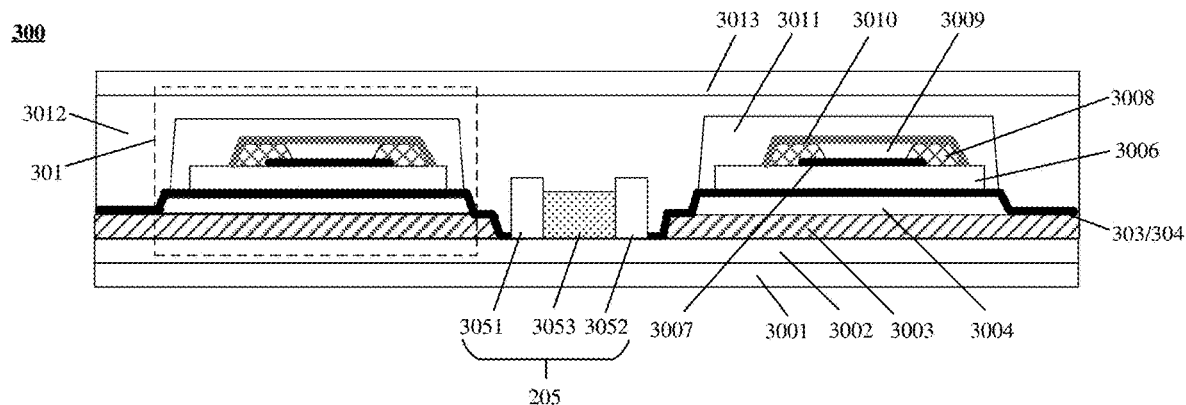
FIG. 4B is a schematically sectional view of the display substrate shown in FIG. 4A.
Figure 5:
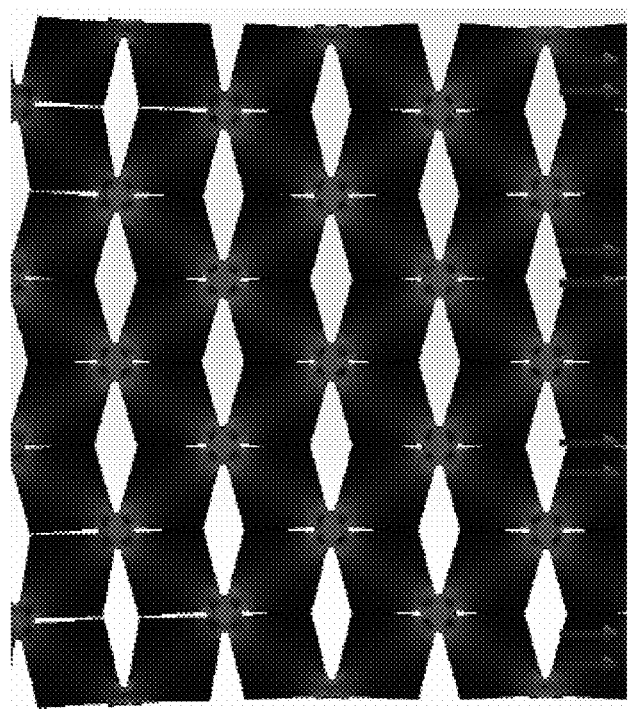
FIG. 5 is a distribution diagram of a stress state of another display substrate according to an embodiment of the present disclosure.

At least one embodiment of the present disclosure also provides a display substrate. FIG. 4A is a schematic plan view of the display substrate; FIG. 4B is a schematically sectional view of the display substrate shown in FIG. 4A, schematically showing a connection relation between each one pixel unit at a boundary in adjacent display units of the display substrate shown in FIG. 4A, the two pixel units, and the deformation sensor located at the connection part. FIG. 5 is a distribution diagram of a stress state of a display substrate according to the embodiment of the present disclosure.

As shown in FIG. 4A, a display substrate 300 includes a plurality of display units 301 and connection parts 302 located among the display units 301. The plurality of display units 301 are configured to display image(s); the connection part 302 is flexible to allow the display substrate 300 to stretch or retract. Each connection part 302 includes a deformation sensor 305 configured to detect a deformation state of the connection part 202.

For example, the connection part 302 includes an elastically deformed part 3021 which is mainly subjected to an amount of elastic deformation when the display substrate 300 is stretched or retracted, and the elastically deformed part 3021 may generate a large amount of deformation when the display substrate 300 is stretched or retracted, for example. At this point, the piezoelectric sensor 305 may be at least partially provided in the elastically deformed part 3021, for example.

For example, the deformation state detected by the deformation sensor 305 includes a deformation way (e.g., stretching or retracting, or the like), an amount of deformation (e.g., a stretching amount or a retracting amount, or the like) of the elastically deformed part 3021, or the like.

For example, in some examples of the present embodiment, the deformation sensor 305 may be in signal communication with an alarm unit (e.g., an alarm). When the deformation sensor 305 detects that the amount of deformation of the connection part 302, for example, the amount of deformation of the elastically deformed part of the connection part 302, reaches a given value, for example, a maximum amount of deformation of the elastically deformed part 3021, the alarm unit may issue an alarm to avoid a damage to the display substrate 300 due to a force further applied by a user.

For example, in some examples of the present embodiment, as shown in FIG. 4A, the display substrate 300 may further include a controller 306. For example, the controller 306 is coupled with the deformation sensors 305, and is configured to receive feedback signals related to the deformation states of the deformation sensors 305 and to adjust the display images of the display units 301 according to the feedback signals. For example, the controller 306 may be disposed in a peripheral area of the display substrate other than the area where the display units 301 and the connection parts 302 are located, so as not to affect the display effect of the display substrate.

For example, in the case where the plurality of the display units 301 display one image, when the connection part 302 is subjected to a force and deformed, the display image of the plurality of display units 301 may also be deformed therewith. At this point, the deformation sensors 305 may detect the deformation states of the connection parts 302, for example, the amount of deformation, and feed the information of deformation states to the controller 306, the controller 306 may adjust the display image of the display units 301 in accordance with the feedback signal(s), thereby compensating the display image of the plurality of display units 301 and enabling the display image to be more fluent.

In the present embodiment, each deformation sensor 305 may be a strain sensor, such as an MEMS capacitance strain sensor, a resistance strain sensor, a piezoelectric sensor based on a piezoelectric effect, or the like, and the embodiments of the present disclosure are not limited thereto.

In the present embodiment, the controller 306 may be any control unit having data processing capability and/or program executing capability, such as a central processing unit (CPU), a digital signal processor (DSP), a single-chip microcomputer, or the like. For example, the controller 306 may further include a storage unit that stores image processing data, parameters, or the like, of the display substrate 300, under a given amount of deformation. For example, the storage unit may be a storage medium in any form, such as a volatile memory, a non-volatile memory, a semiconductor memory, a magnetic medium memory, or the like.

For example, in the present embodiment, as shown in FIGS. 4A and 4B, each deformation sensor 305 is a piezoelectric sensor, including a first electrode 3051, a second electrode 3052, and a piezoelectric material layer 3053 provided between the first electrode 3051 and the second electrode 3052, and the piezoelectric material layer 3053 is configured to detect the stretching amount and the retracting amount.

For example, each piezoelectric sensor may be disposed at a position where a corresponding connection part 302 has the maximum amount of deformation under a force, thereby detecting the maximum amount of deformation of the connection part 302 under the force. For example, before the connection part 302 is provided with the piezoelectric sensor, the distribution diagram of the stress state of the display substrate 300 when stretched may be tested by experiments, thereby obtaining the position at which the display substrate 300 has the maximum stress in the stretched state, and the piezoelectric sensor is disposed at this position. For example, the distribution diagram of the stress state of the display substrate 300 in the stretched state according to the present embodiment is as shown in FIG. 5. As shown in FIG. 5, corner positions of the elastically deformed parts 3021 between the adjacent display units 301 have the maximum stress, and therefore, the piezoelectric sensors may be provided at the corner positions between the adjacent display units 301.

For example, the piezoelectric material layer 3053 of the piezoelectric sensor includes a flexible piezoelectric material which may include an organic piezoelectric material or an inorganic and organic composite piezoelectric material. For example, the organic piezoelectric material includes polyvinylidene fluoride, or the like, the composite piezoelectric material is a composite material in which the inorganic piezoelectric material is added in the organic piezoelectric material, the inorganic piezoelectric material includes a perovskite material, such as aluminum nitride, zinc oxide, titanate barium, lead zirconate titanate, or the like. The piezoelectric material layer 3053 includes a flexible piezoelectric material which enables the piezoelectric material layer 3053 to better match the deformation state of the connection part 302, and to detect the deformation state accurately. In the present embodiment, the material of the piezoelectric material layer 3053 may be selected according to the actual application, for example, the tensile property of the display substrate, or the like, and the embodiments of the present disclosure are not limited thereto.

For example, the first electrode 3051 and/or the second electrode 3052 of the piezoelectric sensor may be made of a metal material, such as Ti, Al, Mo, Ag, etc., or an alloy thereof, or a conductive oxide, such as ITO, IZO, ZnO, $In_2O_3$, IGO, AZO, etc., and the embodiments of the present disclosure are not limited thereto.

For example, as shown in FIG. 4B, the display substrate 300 according to the present embodiment may further include a stretchable substrate 3001 and a flexible layer 3003 arranged on the stretchable substrate 3001. As shown in FIG. 4A, the flexible layer 3003 includes a first part (i.e., the part covered by the display units 301) where the plurality of display units 301 are provided and a second part (i.e., the part covered by the connection parts 302) where the connection parts 302 are provided. The second part of the flexible layer 3003 includes an opening 3003A, and the portion of the connection part 202 corresponding to the opening 3003A may be subjected to a relatively large amount of deformation when the display substrate 300 is stretched or retracted. In this way, the portion of the connection part 202 corresponding to the opening 3003A is the elastically deformed part 3021 of the connection part 202, for example.

For example, the plurality of display units 301 are disposed on the first part of the flexible layer 3003 by an isolation layer 3004, respectively. For example, each display unit 301 may include one or more pixel unit(s) for display (in the drawings, one pixel unit is shown), and each of the pixel units includes a thin film transistor configured to control the pixel unit to emit light or not, an organic light emitting diode, or the like. For example, the organic light emitting diode includes an anode layer 3007, a light emitting layer 3009, a cathode layer 3010, or the like, which are layered on each other. In the present embodiment, the isolation layer 3004 may prevent water, oxygen and other impurities from entering the pixel unit provided on the isolation layer 3004. For example, the isolation layer 3004 may include a single-layer or multilayer structure made of an inorganic material, such as $SiO_x$, $SiON_x$, $SiN_x$, or the like.

For example, the display substrate 300 according to the present embodiment further includes an adhesive layer 3002 located between the stretchable substrate 3001 and the flexible layer 3003 and configured to bind the stretchable substrate 3001 and the flexible layer 3003. For example, the adhesive layer 3002 has a tensile property same as or similar to that of the stretchable substrate 3001. For example, the adhesive layer 3002 may be made of Optically Clear Adhesive (OCA), for example, a resin material, such as an epoxy resin, silicone resin, acrylic resin, or the like.

For example, each opening 3003A included by the second part of the flexible layer 3003 exposes the adhesive layer 2002. The piezoelectric material layer 3053 of the piezoelectric sensor 305 is disposed in the opening 3003A, for example, it is provided on the adhesive layer 3002 exposed by the opening 3003A, such that the piezoelectric material layer 3053 of the piezoelectric sensor 305 merely covers the stretchable substrate 3001 and the adhesive layer 3002. Because no other structure is provided on the stretchable substrate 3001 and the adhesive layer 3002 at the position of the opening 3003A, the position of the opening 3003A tends to have the maximum amount of deformation when the display substrate 300 is stretched and retracted, and the piezoelectric material layer 3053 can detect the maximum amount of deformation of the elastically deformed part 3021 of each connection part 202 with the above-mentioned arrangement.

For example, in the display substrate 300 according to the present embodiment, the first electrode 3051 and the second electrode 3052 may be disposed on the flexible layer 3003, or on the adhesive layer 3002 exposed by the opening, thus the first electrode 3051, the piezoelectric material layer 3053, and the second electrode 3052 are arranged in a direction parallel to the stretchable substrate 3001. That is, the first electrode 2051, the second electrode 2052, and the piezoelectric material layer 3053 are disposed in a same layer (as shown in FIGS. 4A and 4B).

For example, in the present embodiment, as shown in FIG. 4A, each opening 3003A of the flexible layer 3003 is star-shaped. A plurality of angles of the star-shaped structure of the opening 3003A extend toward the connection parts 302 between adjacent display units 301, respectively. The piezoelectric material layer 3053, the first electrode 3051 and the second electrode 3052 of the piezoelectric sensor 305 are disposed in the opening 3003A between the adjacent display units 301. In the present embodiment, compared with the opening with other shapes, the flexible layer 3003 with the star-shaped opening 3003A may be subjected to deformations in more forms, and greater amount of deformation.

For example, in the present embodiment, the first electrode 3051, the piezoelectric material layer 3053, and the second electrode 3052 are arranged in a direction parallel to the stretchable substrate 3001. That is, the first electrode 3051, the second electrode 3052, and the piezoelectric material layer 3053 are provided in the same layer, as shown in FIG. 4B, for example. This arrangement may avoid the interference of the piezoelectric material layer 3053 by the first electrode 3051 and the second electrode 3052 in a process of detecting the stretch deformation or retract deformation, and facilitate the wiring of the first electrode 3015 and the second electrode 3052.

For example, in the present embodiment, as shown in FIGS. 4A and 4B, each connection part 302 includes a first wiring 304 located on the flexible layer 3003. The first wiring 304 extends curvedly and is electrically connected to the piezoelectric sensor 305, for example, to the first electrode 3051 and the second electrode 3052 of the piezoelectric sensor 305, so as to transmit electrical signals for the piezoelectric sensors 305. For example, as shown in FIG. 5, the first wiring 304 may also be connected to the controller 306, such that the piezoelectric sensors 305 may transmit the feedback signals including the information of deformation states to the controller 306 through the first wiring 304.

For example, in the present embodiment, each connection part 302 further includes a second wiring 303 located on the flexible layer 3003. For example, the second wiring 303 is electrically connected to a plurality of display units 301, so as to transmit electrical signals to the plurality of display units 301. For example, as shown in FIG. 5, the second wiring 303 may also be connected to the controller 306, such that the controller 306 may transmit display signals for adjusting the display image(s) to the plurality of display units 301 through the second wiring 303.

For example, the first wiring 304 and/or the second wiring 303 may be made of an elastic metal material, such as titanium, aluminum, silver, gold, or the like, or an alloy thereof, or other conductive materials, such as a conductive rubber, graphene, or the like, and the embodiments of the present disclosure are not limited thereto.

For example, in the present embodiment, the display substrate 300 may have a relatively large amount of deformation due to the elastically deformed region 3021 defined by each opening 3003A of the flexible substrate 3003. That is, each elastically deformed part 3021 is configured as a main deformed part during the display substrate 300 is deformed. Herein, it is to be noted that, other parts of the display substrate 300 other than the elastically deformed part 3021 (e.g., the non-open part of each connection part 302 and the display units 301) may also generate a given amount of deformation, and this amount of deformation contributes to the amount of deformation of the entire display substrate 300 to a small extent.

For example, in the present embodiment, the stretchable substrate 3001 has a higher elasticity than the flexible layer 3003, i.e., it is more easily to be elastically deformed. For example, the stretchable substrate 3001 may be made of a material with a relatively large elasticity, such as polydimethylsiloxane (PDMS), stretchable rubber, silicone, or the like. The flexible layer 3003 may be made of a flexible material, such as polyimide (PI), polyethylene terephthalate (PET), or the like. In the above-mentioned arrangement, the flexible layer 3003 may be deformed when the stretchable substrate 3001 is under a force, for example, when the stretchable substrate 3001 is stretched, the first wiring 304 and the second wiring 303 provided on the buffer flexible layer 3003 are stressed, so as to avoid a damage to the first wiring 304 and the second wiring 303, for example, they are broken.

It is to be noted that the display substrate according to the present embodiment may further include other structures. For example, as shown in FIG. 4B, the display substrate 300, for example, may further include a second adhesive layer 3012, a stretchable package substrate 3013, or the like, each display unit 301 may further include a planarization layer 3006, a pixel defining layer 3008 and a package layer 3011, or the like, and the embodiments of the present disclosure are not limited thereto.

It is to be noted that in the display substrate according to the present disclosure, the display units and various elements of connection parts may also be arranged in other ways.

Figure 6:
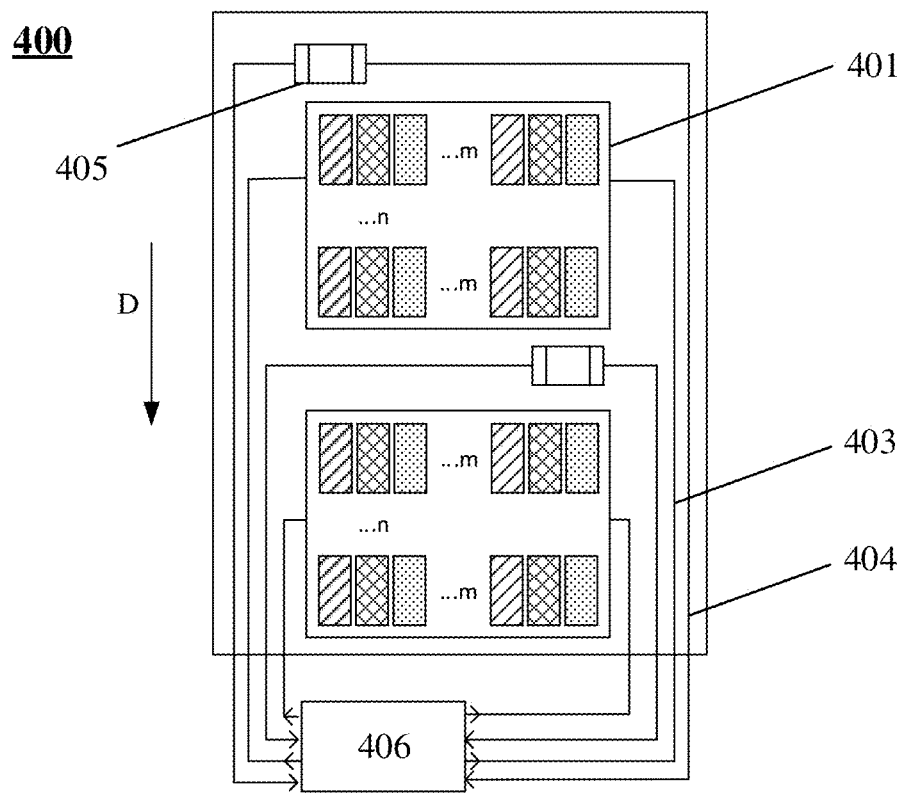
FIG. 6 is a schematic plan view of yet another display substrate according to an embodiment of the present disclosure.

For example, FIG. 6 is a schematic plan view of yet another display substrate according to one embodiment of the present disclosure. For example, as shown in FIG. 6, the deformation sensors 405 are staggered at one side of each display unit 401 and located at each connection part 402 of the display substrate 400 (e.g., the stretching direction of the display substrate 400 is as shown by a one way arrow D in the drawing), and is connected with the controller 406 by the first wiring 404. In addition, the display unit 401 is connected with the controller 406 by the second wiring 403, and thus the controller 406 may receive the deformation state information detected by each piezoelectric sensor 405, and adjust the display image of the display unit 301 based on the information, thereby compensating the display image of the plurality of display units 401, and enabling the display image to be more fluent. In the embodiments of the present disclosure, the arrangements of the display units and various elements of the connection parts are not limited.

Figure 7:
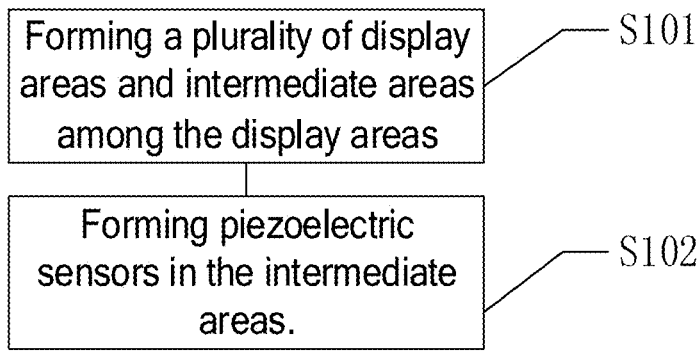
FIG. 7 is a flowchart of a method of manufacturing a display substrate according to an embodiment of the present disclosure.

At least one embodiment of the present disclosure also provides a method of manufacturing a display substrate. As shown in FIG. 7, the manufacturing method includes step S101 and step S102.

Step 101: forming a plurality of display units and connection parts among the display units.

For example, the display unit is configured to display image(s), and each connection part is flexible to allow the display substrate to stretch or retract. For example, the plurality of display units are configured to display images individually, or display one image collectively. For example, each connection part includes an elastically deformed part which may be subjected to a relatively large amount of deformation under a force.

Step 102: forming a deformation sensor at each connection part.

The deformation sensor formed at each connection part is configured to detect a deformation state of the connection part. For example, the deformation sensor is formed at least partially in the elastically deformed part of each connection part, and is configured to detect the deformation state of the elastically deformed part.

For example, the manufacturing method according to the present embodiment may further include: providing a stretchable substrate, and combining the flexible layer onto the stretchable substrate, the flexible layer including a first part corresponding to the plurality of display units and a second part corresponding to the connection parts; each display unit is formed at the first part of the flexible layer, openings are formed at the second part of the flexible layer, each opening defining an elastically deformed part, and each piezoelectric sensor is at least partially formed in the corresponding opening and onto the stretchable substrate.

Hereinafter, the manufacturing method according to at least one embodiment of the present disclosure will be described in detail using the display substrate shown in FIGS. 2A and 2B as an example.

Figure 8A:
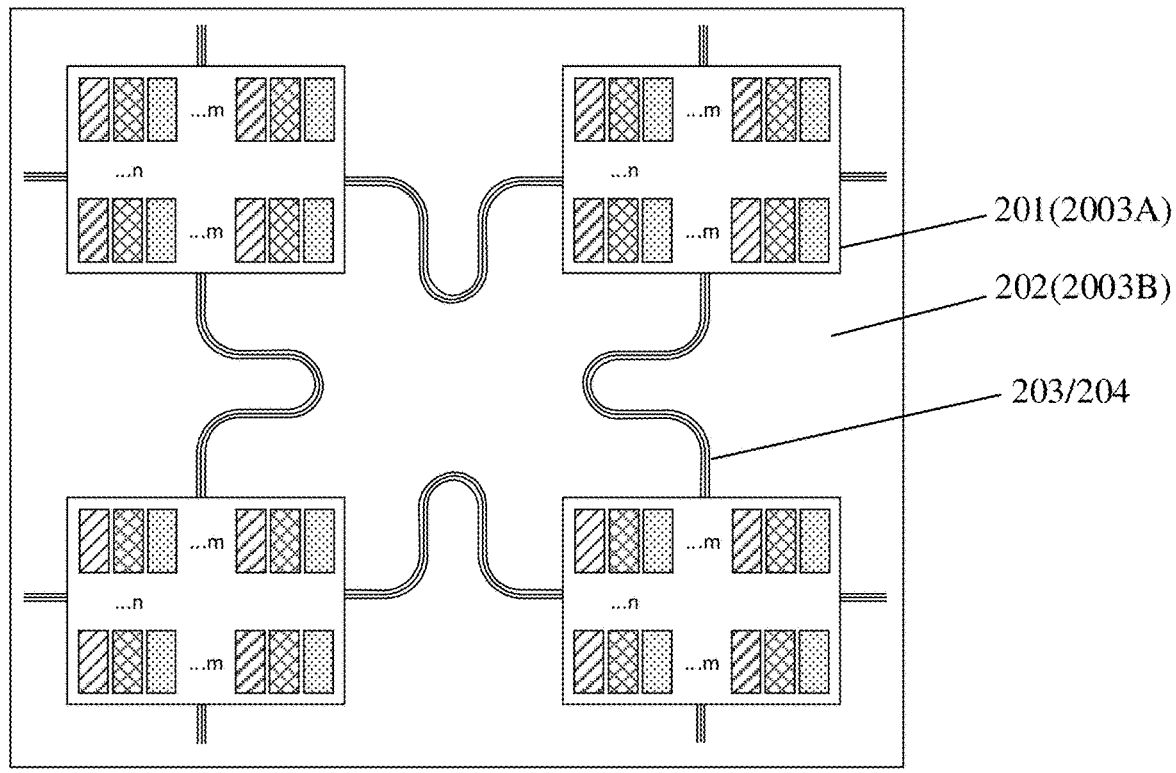
FIGS. 8A and 8C are schematic plan views of a display substrate in a manufacturing process according to an embodiment of the present disclosure.
Figure 8B:
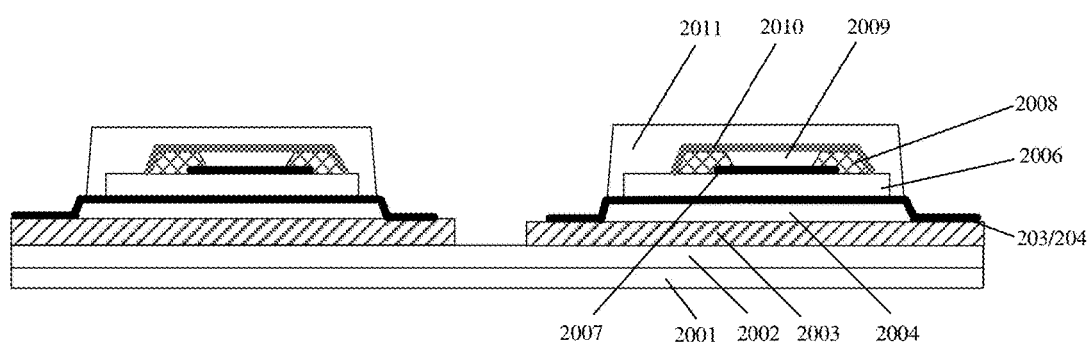
FIGS. 8B, 8D and 8E are schematically sectional views of a display substrate in a manufacturing process according to an embodiment of the present disclosure.
Figure 8C:
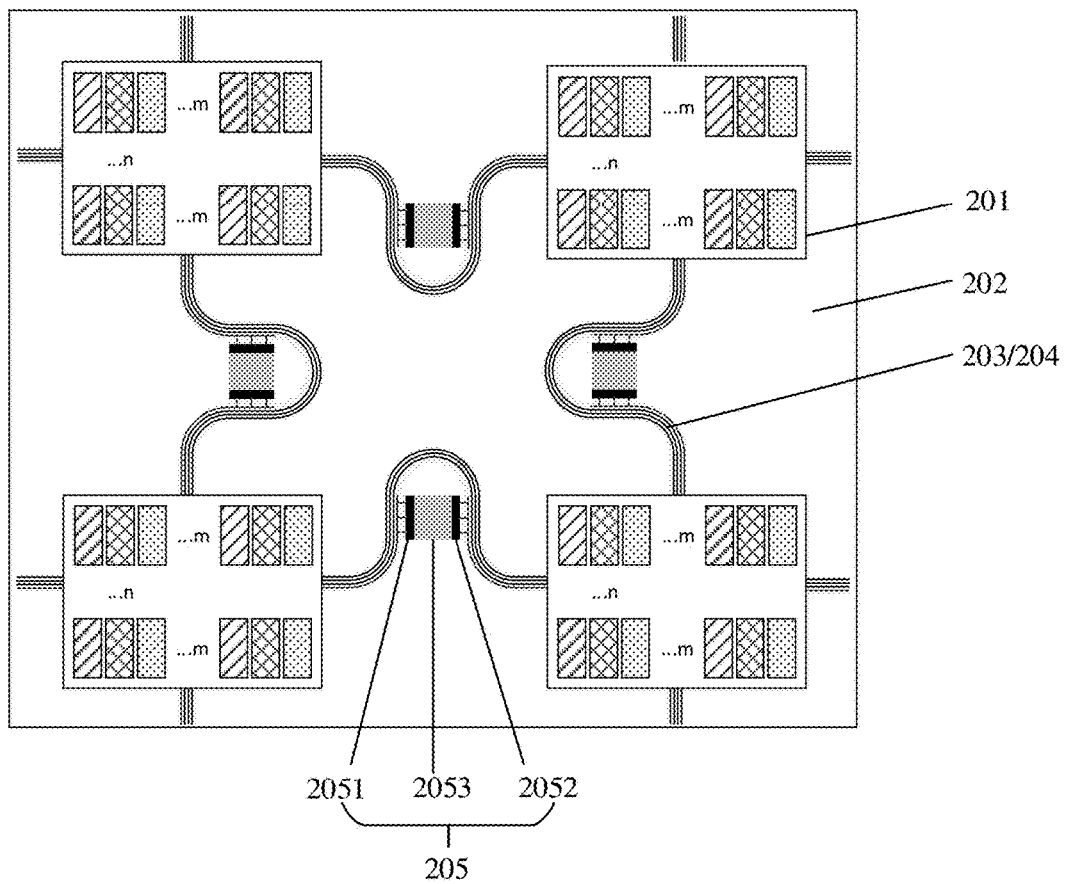
Figure 8D:
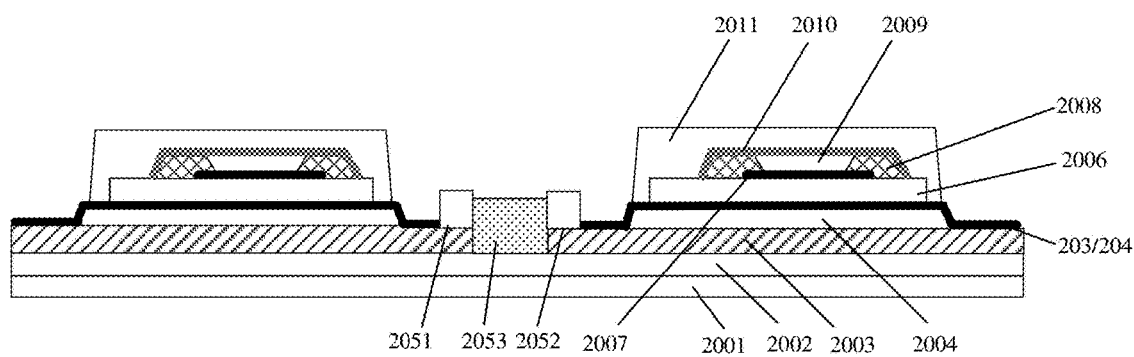
Figure 8E:
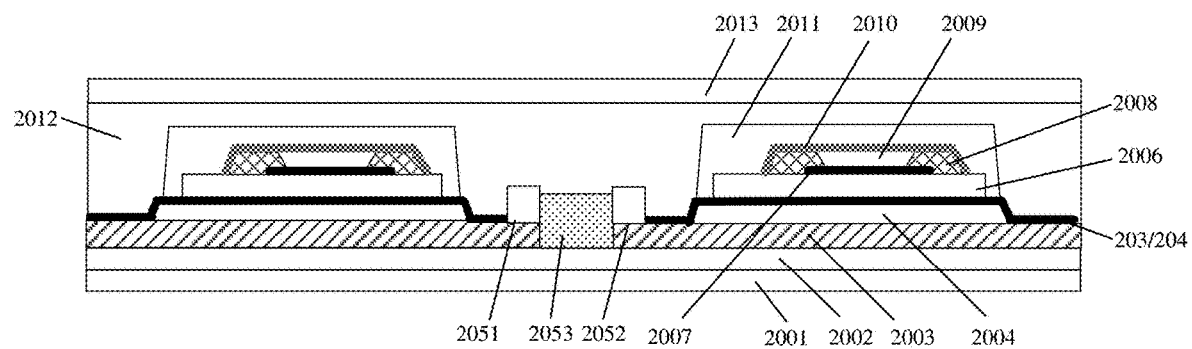

FIGS. 8A and 8C are schematic plan views of a display substrate in a manufacturing process according to one embodiment of the present disclosure, and FIGS. 8B, 8D, and 8E are schematically sectional views of the display substrate in the manufacturing process according to the embodiment of the present disclosure. For the sake of clarity, the sectional views only show a connection relation between one pixel unit in adjacent display units, the pixel unit, and the deformation sensor formed at the connection part.

As shown in FIGS. 8A and 8B, firstly, the plurality of display units 201 are formed at the flexible layer 2003, which define the connection parts 202 among the display units 201. For example, as shown in FIG. 8A, a display array of the display units 201 is formed at the first part 2003A of the flexible layer 2003, the wirings 203, 204 for the connection parts 202 are formed at the second part 2003B of the flexible layer 2003, and openings are formed in the second part 2003B of the flexible layer 2003.

For example, the display array of the display units 201 includes one or more pixel units. For example, after the island-shaped isolation layer 2004 is formed at the first part 2003A of the flexible layer 2003 by a patterning process (e.g., a photolithography process), one or more pixel unit(s) is/are formed on the isolation layer 2004. For example, the forming of the pixel unit includes forming a thin film transistor and an organic light emitting diode, or the like. For example, on the isolation layer 2004, the thin film transistors (not shown) and the wirings 203, 204, the planarization layer 2006, the organic light-emitting diode(s) (including the anode layer 2007, the light-emitting layer 2009 and the cathode layer 2010, or the like, which are layered on each other), and the package layer 2011, or the like are formed. The structures of the pixel units may be formed using conventional ways, and the embodiments of the present disclosure are not limited thereto.

For example, after the display units 201 and the connection parts 202 are formed on the flexible layer 2003, the flexible layer 2003 is patterned to form openings in the flexible layer 2003. For example, the portion of the second part of the flexible layer 2003 other than the portion covered by the wirings 203, 204 is cut off using mechanical cutting or laser cutting, or the like, so as to form openings which define the elastically deformed parts of the connection parts 202. The elastically deformed parts may be subjected to a relatively large amount of deformation.

For example, after the flexible layer 2003 is patterned, the stretchable substrate 2001 is provided and the flexible layer 2003 is combined onto the stretchable substrate 2001, for example, using the adhesive layer 2002.

For example, the stretchable substrate 2001 is made of a material having a higher elasticity than that of the material of the flexible layer 2003. For example, the stretchable substrate 2001 may be made of a material with a relatively large elasticity, such as polydimethylsiloxane (PDMS), stretchable rubber, silicone, or the like. The flexible layer 2003 may be made of a flexible material, such as polyimide (PI), polyethylene terephthalate (PET), or the like. For example, the adhesive layer 2002 may be made of Optically Clear Adhesive (OCA), for example, a resin material, such as an epoxy resin, silicone resin, acrylic resin, or the like.

Figure 9A:
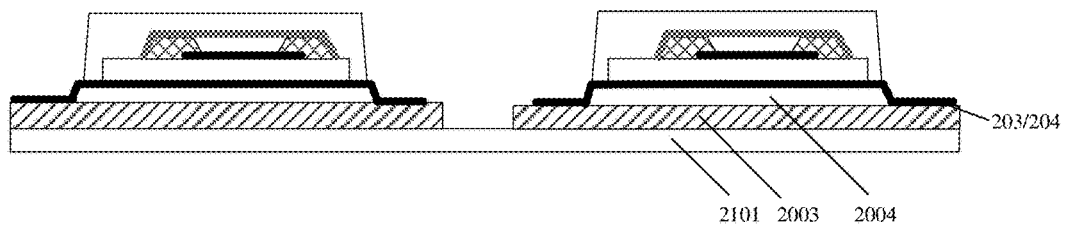
FIGS. 9A to 9C are schematically sectional views of a display substrate in a manufacturing process according to an embodiment of the present disclosure.
Figure 9B:
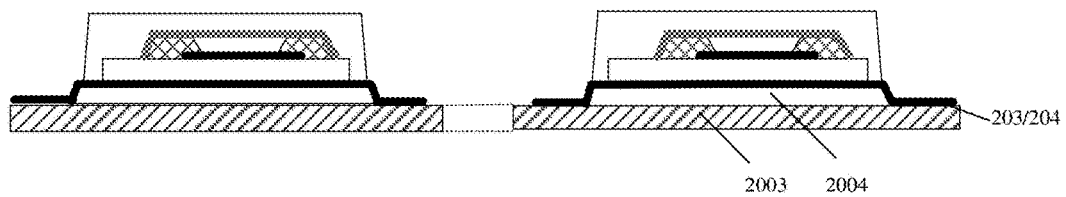
Figure 9C:
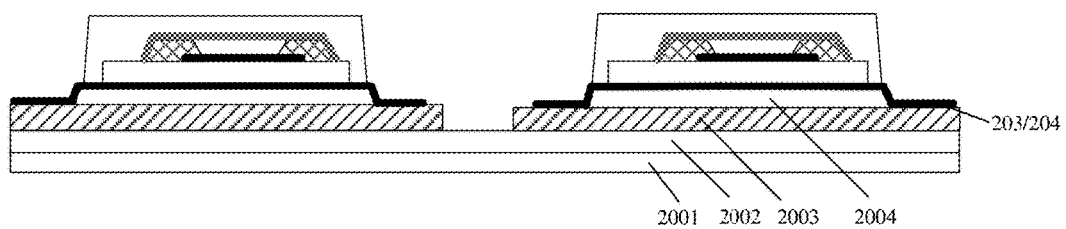

For example, in another example of the present embodiment, as shown in FIG. 9A, the forming a plurality of display units and connection parts among the display units includes: forming a flexible layer 2003 on a rigid base substrate, for example, the flexible layer 2003 is formed on the rigid base substrate 2101 (e.g., a glass substrate, or a quartz plate, or the like) by adhering process; forming a display array of the display units on the first part of the flexible layer 2003, forming the wirings for the connection parts on the second part of the flexible layer 2003 and forming the openings in the second part of the flexible layer. As shown in FIGS. 9B and 9C, the providing the stretchable substrate and combining the flexible layer onto the stretchable substrate includes: releasing the flexible layer 2003 with the display array, the wirings and the openings formed thereon from the rigid base substrate 2101 (FIG. 9B shows the situation after the flexible layer 2003 is released from the rigid base substrate 2101. The broken lines in the figures represent the wiring connection parts which are not shown), and combining onto the stretchable substrate 2001, for example, by the adhesive layer 2002.

For example, after the flexible layer 2003 is combined onto the stretchable substrate 2001, as shown in FIGS. 8C and 8D, the deformation sensors 205 are formed on the stretchable substrate 2001.

For example, each of the deformation sensors 205 is a piezoelectric sensor. The forming of each piezoelectric sensor includes: forming the first electrode 2051, the second electrode 2052, and the piezoelectric material layer 2053 between the first electrode 2051 and the second electrode 2052. For example, the first electrode 2051 and/or the second electrode 2052 and/or the piezoelectric material layer 2053 are formed by an inkjet printing process. For example, in the inkjet printing process, a slurry including particles of a conductive material is formed in a predetermined pattern at a position where the first and second electrodes are to be formed, and the formed pattern is cured to obtain the first and second electrodes. For example, in other examples of the present embodiment, the first electrode 2051 and/or the second electrode 2052 and/or the piezoelectric material layer 2053 may be formed by a photolithography process.

For example, the piezoelectric material layer 2053 of each piezoelectric sensor includes a flexible piezoelectric material which may include an organic piezoelectric material or an inorganic and organic composite piezoelectric material. For example, the organic piezoelectric material includes polyvinylidene fluoride, or the like, the composite piezoelectric material is a composite material in which the inorganic piezoelectric material is added in the organic piezoelectric material, the inorganic piezoelectric material includes a perovskite material, such as aluminum nitride, zinc oxide, titanate barium, lead zirconate titanate, or the like. For example, the first electrode 2051 and/or the second electrode 2052 of each piezoelectric sensor may be made of a metal material, such as Ti, Al, Mo, Ag, or the like, or an alloy thereof, or a conductive oxide, such as ITO, IZO, ZnO, $In_2O_3$, IGO, AZO, or the like. The material of various parts of the piezoelectric sensor 205 of the embodiments of the present disclosure are not limited thereto.

For example, before the piezoelectric sensors are formed, the distribution diagram of the stress state of the stretchable substrate 2001 formed with the display units 201 when stretched may be tested by experiments, to obtain a position at which the stretchable substrate 2001 has the maximum stress in a stretched state, and the piezoelectric sensor is disposed at the position. For example, in the present embodiment, the piezoelectric sensor may be disposed at the middle position between the adjacent display units 201.

For example, the piezoelectric material layer 2053 of each piezoelectric sensor is formed on the adhesive layer 2002 exposed by the corresponding opening of the flexible layer 2003, such that the piezoelectric material layer 2053 of the piezoelectric sensor only covers the stretchable substrate 2001 and the adhesive layer 2002. For example, the first electrode 2051 and the second electrode 2052 of the piezoelectric sensor may be formed on the flexible layer 2003 or on the adhesive layer 2002 exposed by the corresponding opening. For example, when the first electrode 2051 and the second electrode 2052 are formed on the adhesive layer 2002 exposed by the opening, the materials of the first electrode 2051 and the second electrode 2052 may be formed on the adhesive layer 2002 by an inkjet printing process. In the inkjet printing process, a temperature of the printing material is low, which avoids the damage to the adhesive layer 2002 due to the high temperature during preparation.

For example, the wirings and/or pads configured to connect the controller may further be formed on the stretchable substrate 2001. The controller is for example, bonded at the stretchable substrate 2001, and is electrically connected with the wirings 203, 204, respectively, to receive feedback signals of the piezoelectric sensors, and adjusting the display image(s) of the display units 201 in accordance with the feedback signals. For example, the controller may be formed in the peripheral area of the stretchable substrate 2001 other than the area where the display units 201 and the connection parts 202 are located, so as not to affect the display effect of the display substrate.

For example, after each of the above-mentioned functional structures is formed, as shown in FIG. 8E, the stretchable substrate 2013 for package is combined with the stretchable substrate 2001 and functional structures on the stretchable substrate 2001 by using the second adhesive layer 2012. For example, the second adhesive layer 2012 is made of the same material as the adhesive layer 2002, and the stretchable substrate 2013 is made of the same material as the stretchable substrate 2001. In this way, the display substrate 200 is formed.

The manufacturing method according to the present embodiment may also be used to manufacture the display substrate as shown in FIGS. 4A and 4B. The present example is different from the above-described example in that the display substrate has different arrangements of the wirings 303, 304, and different shapes of the openings in the flexible layer 3003, so the structures are manufactured a little different. Except that, other structures on the display substrate are formed in similar ways as the above-mentioned examples and may refer to the above-mentioned examples, no description is repeated here.

At least one embodiment of the present disclosure provides a display control method of any one of the above-mentioned display substrates, including: detecting, by each deformation sensor, a deformation state of a connection part of a display substrate in a stretching operation or a retracting operation, for example, a deformation type and amount of deformation; adjusting a display image of a display unit of the display substrate according to a signal detected by the deformation sensor, and compensating the image, and the display effect of the display substrate is improved. For example, for the deformation of the display substrate itself, the display image is reversely deformed appropriately to cancel out the deformation of the display substrate due to the stretch or retract operations. For example, by adjusting the brightness or the color of each of the pixel units in each display unit, the stretched image is compensated; or by adjusting the color of each of the pixel units in each display unit, the stretched image is compensated.

For example, the controller may be configured to receive detection signals related to deformation states detected by deformation sensors, and adjust display image(s) of the display units of the display substrate in accordance with the detection signals of the deformation sensors. For example, the controller may be any control unit having the data processing capability and/or program executing capability. For example, the controller may further include a storage unit that stores image processing data of the display substrate with a given amount of deformation. For example, the storage unit may be a storage medium in any form, such as a volatile memory, a non-volatile memory, or the like. In this way, the controller may purposefully adjust the display images of the display substrate according to the deformation states of the display substrate, and the display effect of the display substrate is improved.

The following statements should be noted:

(1) The accompanying drawings involve only the structure(s) in connection with the embodiment(s) of the present disclosure, and other structure(s) can be referred to common design(s).

(2) For the purpose of clarity, in the accompanying drawings for illustrating the embodiment(s) of the present disclosure, the thickness of a layer or a region may be enlarged or thinned, that is to say, the drawings are not drawn according to the actual scales. It is to be understood that, in the case in which a component, such as a layer, a film, an area, a substrate, or the like, is described to be "on" or "under" another component, it may be directly on or under the another component, or a component may be interposed therebetween.

(3) without conflict with each other, embodiments and elements in the embodiments can be combined to reach new embodiment(s).

The description above is only about the specific embodiments of the present disclosure, and the scope of the present disclosure is not limited thereto. Any changes or substitutions readily conceived by those skilled in the art within the technical scope of the present disclosure shall fall within the scope of the present disclosure. The scope of the present disclosure is defined by the claims.

What is claimed is:

1. A display substrate, comprising:
a plurality of display units;
connection parts among the display units, the connection parts being flexible to allow the display substrate to stretch or retract;
a stretchable substrate, and a flexible layer provided on the stretchable substrate;
wherein the plurality of display units and the connection parts are provided on the flexible layer; and
each connection part comprises a deformation sensor configured to detect deformation states of the connection part, wherein the deformation sensors are piezoelectric sensors, each of which comprises a first electrode, a second electrode, and a piezoelectric material layer between the first and second electrodes.

2. The display substrate according to claim 1, wherein the plurality of display units are arranged in an array, and each connection part is located between two adjacent rows of display units or two adjacent columns of display units.

3. The display substrate according to claim 2, further comprising a controller coupled with the deformation sensors and configured to receive feedback signals related to the deformation states of the deformation sensors, and adjust display images of the display units according to the feedback signals.

4. The display substrate according to claim 3, wherein the flexible layer comprises a plurality of openings at the connection parts.

5. The display substrate according to claim 4, wherein each opening is star-shaped, and angles of the star-shaped openings extend toward the connection parts of the adjacent display units.

6. The display substrate according to claim 1, further comprising a controller coupled with the deformation sensors and configured to receive feedback signals related to the deformation states of the deformation sensors, and adjust display images of the display units according to the feedback signals.

7. The display substrate according to claim 6, wherein the flexible layer comprises a plurality of openings at the connection parts.

8. The display substrate according to claim 7, wherein each opening is star-shaped, and angles of the star-shaped openings extend toward the connection parts of the adjacent display units.

9. The display substrate according to claim 7, wherein at least part of each deformation sensor is provided in a corresponding opening.

10. The display substrate according to claim 1, wherein each piezoelectric material layer comprises a flexible piezoelectric material.

11. The display substrate according to claim 10, further comprising an adhesive layer between the stretchable substrate and the flexible layer and combining the stretchable substrate and the flexible layer;
wherein the first electrode, the second electrode, and the piezoelectric material layer are arranged in a direction parallel to the stretchable substrate;
the piezoelectric material layer is provided on the adhesive layer exposed by a corresponding opening, and the first electrode and second electrodes are provided on the flexible layer, or on the adhesive layer exposed by the corresponding opening.

12. The display substrate according to claim 11, wherein each connection part comprises a first wiring on the flexible layer;
wherein the first wiring extends curvedly and is electrically connected with a corresponding piezoelectric sensor and configured to transmit electrical signals to the corresponding piezoelectric sensor.

13. The display substrate according to claim 12, wherein the connection part further comprises a second wiring located on the flexible layer;
the second wiring extends curvedly and is electrically connected with the plurality of display units and configured to transmit electrical signals to the plurality of display units.

14. The display substrate according to claim 13, wherein the first wiring and the second wiring extend in parallel to each other.

15. The display substrate according to claim 14, wherein a portion of the connection parts other than another portion covered by the first wiring and the second wiring does not comprise the flexible layer.

16. A method of manufacturing a display substrate, comprising,
forming a plurality of display units and connection parts among the display units, the connection parts being flexible to allow the display substrate to stretch or retract;
providing a deformation sensor in each connection part, the deformation sensor being configured to detect a deformation state of each connection part;
the method further comprising:
providing a stretchable substrate, and combining a flexible layer onto the stretchable substrate, wherein the flexible layer comprises a first part corresponding to the plurality of display units and a second part corresponding to the connection parts;
the display units are formed on the first part of the flexible layer, openings are formed in the second part of the flexible layer, wherein each deformation sensor is at least partially provided on the stretchable substrate in a corresponding opening, wherein each deformation sensors is a piezoelectric sensor, the forming of the piezoelectric sensor comprises:
forming a first electrode, a second electrode, and a piezoelectric material layer between the first and second electrodes, wherein at least one of the first electrode the second electrode, and the piezoelectric material layer are formed by an inkjet printing process.

17. The manufacturing method according to claim 14, wherein the forming of the plurality of display units and the connection parts among the display units comprises:
forming the flexible layer on a rigid base substrate;
forming a display array for the display units on the first part of the flexible layer, forming the wiring for the connection parts on the second part of the flexible layer and forming the openings in the second part of the flexible layer; and
the providing the stretchable substrate and combining the flexible layer onto the stretchable substrate comprises:
releasing the flexible layer with the display array, the wiring and the openings formed thereon from the rigid base substrate and combining the released flexible layer onto the stretchable substrate.

18. A display control method of a display substrate, wherein the display substrate comprises:

a plurality of display units;

connection parts among the display units, the connection parts being flexible to allow the display substrate to stretch or retract;

a stretchable substrate, and a flexible layer provided on the stretchable substrate;

wherein the plurality of display units and the connection parts are provided on the flexible layer; and each connection part comprises a deformation sensor configured to detect deformation states of the connection part, wherein the deformation sensors are piezoelectric sensors, each of which comprises a first electrode, a second electrode, and a piezoelectric material layer between the first and second electrodes, wherein the method comprises:

detecting a deformation state of each connection part of the display substrate when stretched or retracted by the deformation sensor; and adjusting a display image of each display unit of the display substrate based on a signal detected by the deformation sensor.

* * * * *